(12) United States Patent
Krzyzanowski et al.

(10) Patent No.: US 7,579,961 B2
(45) Date of Patent: Aug. 25, 2009

(54) DEVICE CONTROL SYSTEM, METHOD, AND APPARATUS

(75) Inventors: Paul Krzyzanowski, Flemington, NJ (US); Keith Nelson, Boca Raton, FL (US); Glenn Harter, Wellington, FL (US); Jonathan Alaimo, Delray Beach, FL (US)

(73) Assignee: OpenPeak Inc., Boca Raton, FL (US)

( * ) Notice: Subject to any disclaimer, the term of this patent is extended or adjusted under 35 U.S.C. 154(b) by 485 days.

(21) Appl. No.: 11/226,379

(22) Filed: Sep. 15, 2005

(65) Prior Publication Data

US 2006/0007015 A1    Jan. 12, 2006

Related U.S. Application Data

(63) Continuation-in-part of application No. 10/783,017, filed on Feb. 23, 2004, now Pat. No. 7,129,855.

(60) Provisional application No. 60/505,851, filed on Sep. 26, 2003.

(51) Int. Cl.
*G08C 19/00* (2006.01)
(52) U.S. Cl. .............. 340/825.72; 340/825.69; 340/5.6; 340/5.64; 340/5.61; 340/825.22; 340/5.74; 340/5.2; 340/5.1; 340/5.22; 340/5.27
(58) Field of Classification Search .......... 340/5.6, 340/5.64, 5.61, 825.69, 825.72, 825.22, 5.2, 340/5.1, 5.27
See application file for complete search history.

(56) References Cited

U.S. PATENT DOCUMENTS

| 5,410,326 | A | 4/1995 | Goldstein |
| 6,208,341 | B1 * | 3/2001 | van Ee et al. ............ 715/716 |
| 6,267,678 | B1 | 7/2001 | Kubo et al. |
| 6,563,430 | B1 | 5/2003 | Kemink et al. |
| 6,665,020 | B1 | 12/2003 | Stahl et al. |
| 6,885,643 | B1 | 4/2005 | Teramoto et al. |
| 2003/0163542 | A1 * | 8/2003 | Bulthuis et al. .......... 709/208 |
| 2005/0052423 | A1 | 3/2005 | Harris et al. |

FOREIGN PATENT DOCUMENTS

EP    0763 806    *    3/1997

OTHER PUBLICATIONS

Patent Cooperation Treaty, International Search Report and Written Opinion, International Application No. PCT/US 04/28470, mailed on Sep. 23, 2005, 7 pages.
Search Report and Written Opinion for International Application No. PCT/US06/36195 mailed Mar. 20, 2008, 9 pages.

* cited by examiner

*Primary Examiner*—Vernal U Brown
(74) *Attorney, Agent, or Firm*—Sterne, Kessler, Goldstein Fox PLLC

(57) ABSTRACT

A system, method, and apparatus for controlling consumer electronic (CE) devices are provided. A remote control unit controls one or more CE devices by obtaining control information necessary to control each CE device from a Consumer Electronic Device Control Database (CEDB). A CEDB provides control information, such as command codes and metadata, for various CE devices as well as providing a mapping between CE device types, CE brands, and particular CE devices. A remote control unit accesses the records provided by a CEDB to provide automatic and programistic control of CE devices.

21 Claims, 20 Drawing Sheets

| model_type_id | model_type_name |
|---|---|
| 1 | dvd |
| 2 | cd |
| 3 | receiver |
| 4 | tv |
| 5 | combodvdver |
| 6 | cable |

FIG. 4A

| company_id | company_name |
|---|---|
| 1 | Sony |
| 2 | Panasonic |
| 3 | Toshiba |
| 4 | Pioneer |
| 5 | ABC |
| 6 | Acorn |

FIG. 4B

| codeset_id | codeset_name | model_type_id | company_id |
|---|---|---|---|
| 1 | Generic ABC cable 1 | 6 | 5 |
| 2 | Generic ABC cable 2 | 6 | 5 |
| 3 | Generic ABC cable 3 | 6 | 5 |
| 4 | Generic Acorn cable 1 | 6 | 6 |
| 5 | Generic Acorn cable 2 | 6 | 6 |
| 6 | Generic Toshiba tv 1 | 4 | 3 |

FIG. 4C

| model_id | model_name | model_type_id | company_id | codeset_id | codeset_applicable |
|---|---|---|---|---|---|
| 1000 | CE19H15 | 4 | 3 | 0 | 0 |
| 1002 | 14AF43 | 4 | 3 | 0 | 0 |
| 1003 | 14AF44 | 4 | 3 | 1 | 6 |
| 1004 | 27A42 | 3 | 3 | 0 | 0 |
| 1005 | 27A43 | 4 | 3 | 0 | 0 |
| 1006 | 27A44 | 2 | 4 | 0 | 0 |

FIG. 4D

| command_id | command_name |
|---|---|
| 1 | channel_down |
| 2 | channel_up |
| 3 | mute |
| 4 | volume_down |
| 5 | volume_up |
| 6 | numeric_0 |

FIG. 4E

| code_id | code |
|---|---|
| 1 | 0000 013E 0000 0006 0003 0C76 0003 0876 0003 1234 |
| 2 | 0000 013E 0000 0006 0003 0C76 0003 0876 0003 2345 |
| 3 | 0000 013E 0000 0006 0003 0C76 0003 0876 0003 5678 |
| 4 | 0000 013E 0000 0006 0003 0C76 0003 0C76 0003 A123 |
| 5 | 0000 013E 0000 0006 0003 0C76 0003 0C76 0003 1B14 |
| 6 | 0000 013E 0000 0006 0003 0C76 0003 0876 0003 DE32 |
| 7 | 0000 013E 0000 0006 0003 0C76 0003 0C76 0003 A321 |
| 8 | 0000 013E 0000 0006 0003 0C76 0003 0C76 0003 BBE1 |
| 9 | 0000 013E 0000 0006 0003 0C76 0003 0876 0003 CAB1 |

FIG. 4F

| model_id | command_id | code_id | multicodenumber | transmission_type |
|---|---|---|---|---|
| 1002 | 2 | 3 | 1 | 1 |
| 1002 | 2 | 4 | 2 | 1 |
| 1002 | 3 | 5 | 1 | 1 |
| 1002 | 3 | 6 | 2 | 1 |
| 6 | 2 | 1 | 1 | 1 |
| 6 | 3 | 2 | 1 | 1 |

FIG. 4G

| input_id | model_id | model_type_id | company_id | list_number | tunable | label |
|---|---|---|---|---|---|---|
| 1 | 1002 | 4 | 3 | 0 | 1 | TV |
| 1 | 1002 | 4 | 3 | 1 | 0 | video1 |
| 3 | 1002 | 4 | 3 | 2 | 0 | video2 |
| 4 | 1003 | 4 | 3 | 0 | 1 | TV |
| 5 | 1003 | 4 | 3 | 1 | 0 | video |
| 6 | 1003 | 4 | 3 | 2 | 0 | svideo |

FIG. 4H

| | | |
|---|---|---|
| model_id | 1002 | 1003 |
| model_type_id | 4 | 4 |
| company_id | 3 | 3 |
| validMask | 57632 | 57631 |
| afterChannelDelayTime | 0 | 0 |
| afterInputDelayTime | 0 | 0 |
| beginChannel | 2 | 0 |
| delayTime | 0 | 0 |
| inputPulseTime | 0 | 0 |
| powerDelayTime | 0 | 0 |
| inputType | cycle | discrete |
| oneDigit | oneDigit | oneDigit |
| twoDigits | threeDigits | threeDigits |
| threeDigits | plus100 | plus100 |
| fourDigits | cannot | cannot |
| powerMethod | toggle | toggle |
| powerOffMethod | toggle | toggle |
| switchMethod | full | full |
| osdUseInputIRAsClosure | true | false |
| osdUseClosure2 | false | true |

FIG. 4I

```
<device type="DVD">
  <make name="Toshiba">
    <model name="SD-3960">
      <ircodes>
        <power>{OMMITTED}</power>
        <play>{OMMITTED}</play>
      </ircodes>
      <meta>
        <delayTime tag_value="200"></delayTime>
        <powerdelaytime tag_value="1500"></powerdelaytime>
        <irpulsetime tag_value="250"></irpulsetime>
        <afterinputdelaytime tag_value="200"></afterinputdelaytime>
        <afterchandelaytime tag_value="200"></afterchandelaytime>
        <inputpulsetime tag_value="250"></inputpulsetime>
        <nodiscretepower tag_value="yes"></nodiscretepower>
        <alwayson tag_value="no"></alwayson>
        <input-type tag_value="cycle"></input-type>
        <beginchannel tag_value="2"></beginchannel>
        <powermethod tag_value="toggle"></powermethod>
        <poweroffmethod tag_value="toggle"></poweroffmethod>
      </meta>
    </model>
  </make>
</device>
```

FIG. 5

DEVICE CONTROL SYSTEM, METHOD, AND APPARATUS

CROSS-REFERENCE TO RELATED APPLICATIONS

This application is a continuation-in-part of commonly owned, co-pending U.S. patent application Ser. No. 10/783,017, filed Feb. 23, 2004, which claims benefit of U.S. Provisional Application No. 60/505,851, filed Sep. 26, 2003, which are incorporated by reference as if fully set forth herein.

BACKGROUND OF THE INVENTION

1. Field of the Invention

The present invention is generally directed to device control. In particular, the present invention relates to a system, method and apparatus for controlling consumer electronic devices.

2. Background

The majority of consumer electronic (CE) devices currently available to end users are remotely controllable through handheld remote control units that transmit command codes via infra-red (IR) signals intelligible by CE devices. Such CE devices may include, but are not limited to, televisions (TVs), digital video disc (DVD) players, personal video recorders (PVRs), compact disc (CD) players, and stereo receivers. Example command codes for controlling such devices include, but are not limited to, power on/off, channel select, channel up/down, and volume up/down.

Each CE device responds to a particular set of command codes. When an end user selects an operation or function on a remote control unit, a command code corresponding to the CE device for the selected operation or function is converted by the remote control unit into signals that are transmitted to and received by the CE device. In turn, the CE device converts the received signals into a command code and then executes the function corresponding to the code.

Unfortunately, there is no standardization of command codes across manufacturers and, in many cases, even for a particular manufacturer. For example, the command code for PLAY on a Yamaha DVD player is different from the command code for PLAY on a Sony DVD player. Furthermore, a single manufacturer may use different command code sets among similar devices as several original design manufacturers (ODM) are utilized, component suppliers are changed, or the technology is refined to accommodate new capabilities.

The lack of standardization has resulted in hundreds of disparate command code sets for thousands of different devices. For example, most manufacturers of CE devices controllable by infrared (IR) signals emitted by a remote control unit have standardized on pulse-code modulation (PCM) with a 30-60 kHz carrier frequency (36-38 kHz being the most common) to transmit command codes. However, there is little agreement on the data format. For example, some data formats have a pre-burst header, while others require that the data be sent twice for fault tolerance. In addition, the formats of command codes are rarely disclosed to the public by CE device manufacturers.

Efforts by third parties to collect the ever increasing universe of command code sets have produced collections that are deficient. Most of these collections provide only a mapping between command code sets and manufacturers. These collections generally do not provide a mapping between individual CE devices and command code sets. Hence, an end user wishing to control a CE device using a third party remote control may need to experiment with various command code sets that are designated for the manufacturer until a suitable command code set is identified.

Furthermore, these collections do not provide additional information or metadata necessary for automated or programmed control. Existing collections, which contain only command code sets, can be sufficient when an end user operates a remote control by sending one command after another. In such circumstances, the end user can monitor the CE device and adjust the subsequent commands that are sent until the desired operation is performed by the CE device. But to support an automated or programmed control, which may, for example, send several commands automatically in sequence, additional information beyond command codes is required. For example, suppose an intelligent remote control wishes to support a programmed control that turns on a television and sets it to channel 3. The intelligent remote will need to know how long it will take the TV to turn on and be ready to receive additional command codes. Furthermore, the intelligent remote needs to know whether it should send only a '3' command code, a '0' and '3' command codes, or a '3' and 'enter' command codes to tune the TV to channel 3. Since prior collections do not provide such metadata, prior collections are inadequate to support automated or programmed controls.

In addition, the lack of metadata in prior collections has required end users to familiarize themselves with the control idiosyncrasies of each CE device. For example, suppose two televisions having a different manufacturer or model type have control idiosyncrasies relating to setting the input state. The end user must become familiar with the different series of commands that must be sent to each television to achieve an identical function of setting the input state. If metadata describing these idiosyncrasies were available, an intelligent remote control could automatically execute the appropriate commands unique to each television and provide the end user with a single set input command that hides the idiosyncrasies of how each device is actually controlled.

What is desired, then, is a database of command codes and metadata for specific CE device models along with a system, method and apparatus that are capable of utilizing such a database to provides true automatic and programistic control of a variety of CE devices.

BRIEF SUMMARY OF THE INVENTION

The invention disclosed herein provides a system, method, and apparatus for controlling consumer electronic (CE) devices. A remote control unit, in accordance with the present invention, controls one or more CE devices by obtaining control information necessary to control each CE device from a Consumer Electronic Device Control Database (CEDB).

A CEDB provides control information, such as command codes and metadata, for various CE devices as well as a mapping between CE device types, CE brands, and particular CE devices. An exemplary CEDB, in accordance with the present invention, organizes the mapping and control information into nine tables. The nine tables include a Model_Type table, a Company table, a Model table, a Codeset table, a Transmission table, a Command table, a Code table, an Input table, and a Metadata table. Each table includes one or more records and each record includes a set of data elements that are interrelated.

A remote control unit, in accordance with the present invention, accesses the records provided by a CEDB to provide automatic and programistic control of CE devices.

Records are accessed to locate appropriate codes as well as to determine the appropriate manner of transmitting the codes to command a CE device.

In an embodiment, a remote control unit is configured to control a CE device by allowing a user to select from among the available CE devices on a CEDB. The user is first asked to select a CE device type available on the CEDB. Next, the user is asked to select a brand for which a CE device of the specified type is available in the CEDB. Finally, a user is provided with a list of CE devices that is of the specified type and brand. Once a user selects a particular CE device, the configuration process is completed, for example, by copying records corresponding to the CE device from the CEDB into the remote control unit's local user database.

In another embodiment, a remote control is configured to execute a script that accesses the records provided by the CEDB to provide automatic and programistic control of CE devices.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 4A-4I are depictions of exemplary records of an exemplary CEDB of the present invention.

FIG. 5 is a depiction of an exemplary XML format for representing data for a CEDB in accordance with the present invention.

Figure 1:
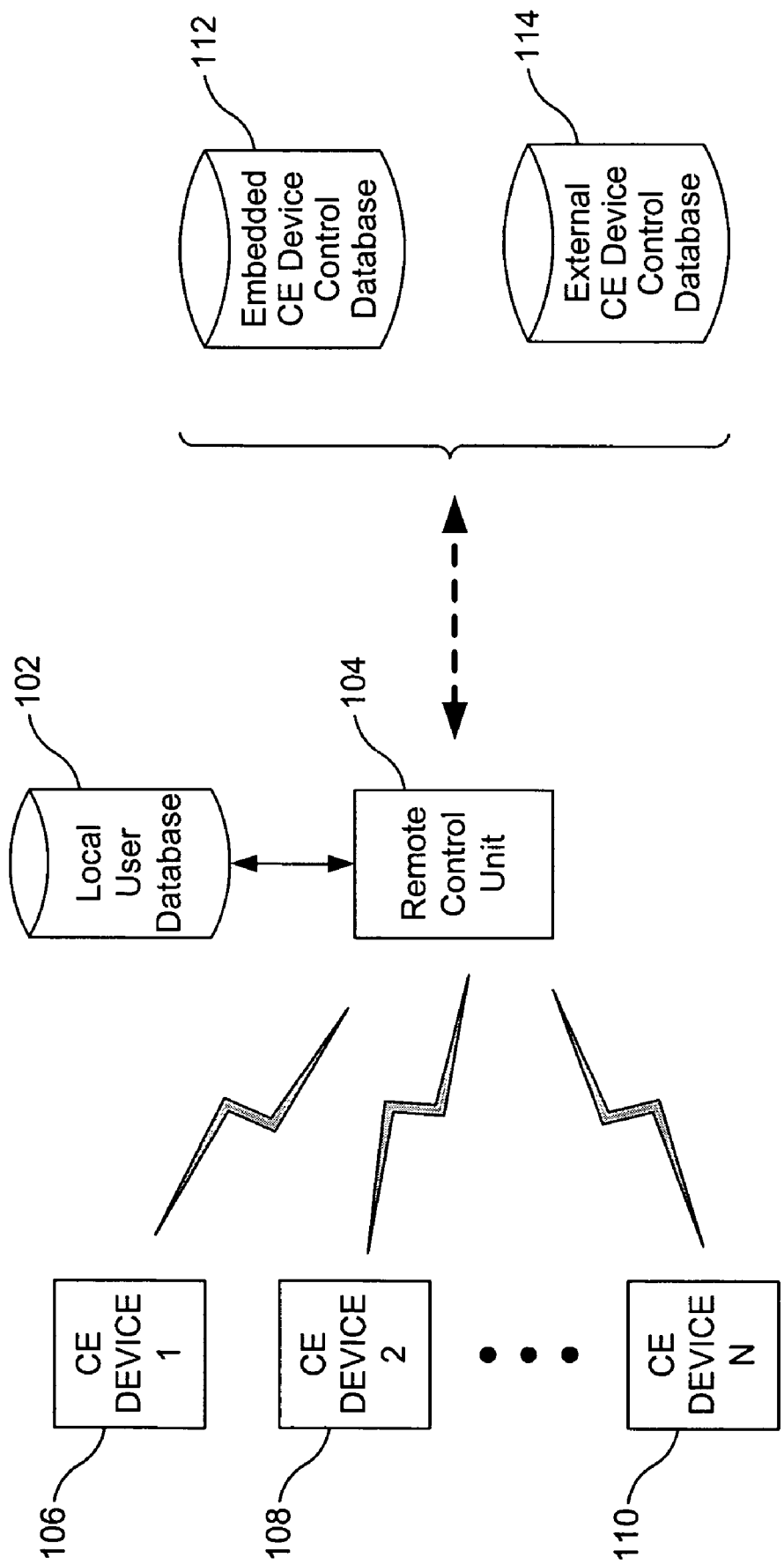
FIG. 1 depicts components of an exemplary remote control system in accordance with the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

FIG. 1 depicts components of an exemplary remote control system in accordance with the present invention and includes a remote control unit 104 and consumer electronic (CE) devices 106, 108 and 110. Remote control unit 104 permits a user to control one or more CE devices each having a different manufacturer and/or model type. Each CE device 106, 108 and 110 may comprise devices such as a television, video cassette recorder (VCR), DVD player, stereo receiver, electronic thermostat, lamp, video camera, MP3 player or the like. These examples are not intended to be limiting, however, and each CE device 106, 108, and 110 may comprise other electronic devices not listed above.

Remote control unit 104 includes a local user database 102 which is used to hold control information for each CE device that the remote control unit 104 is configured to control. Control information includes command codes and metadata of a particular CE device. When remote control unit 104 is configured, for example, to control CE devices 106, 108, and 110, control information for each CE device 106, 108, and 110 is stored in the local user database 102.

In configuring the remote control unit 104 for a CE device, control information for the CE device is retrieved from a Consumer Electronic Device Control Database (CEDB). The remote control unit 104 may access either a CEDB 112 that is embedded in the remote control unit 104 or an external CEDB 114 that is accessible to the remote control unit 104 through an external interface, such as a network interface or an interface to access a removal storage medium. Examples of network interfaces include an Ethernet interface, an IEEE 1394 interface, and a WiFi network interface having an IEEE 802.11b-compliant transceiver. Examples of removal storage mediums include a flash memory card, USB storage device, CD, and DVD. These examples are not intended to be limiting, and remote control unit 104 may access an external CEDB through a variety of external interfaces.

Once the remote control unit 104 is configured to control a CE device, a user may select a function on the remote control unit 104 to control one or more of the configured CE devices. When a user selects a function, the remote control unit 104 accesses control information in the local user database 102 and transmits one or more command codes to the appropriate CE devices.

In the embodiment depicted in FIG. 1, the set of command codes associated with each CE device 106, 108, and 110 comprise IR codes, which are transmitted from remote control unit 104 to the appropriate CE device via a wireless communication link, such as a one or two-way infra-red (IR) communication link. The use of IR communication for remote control of CE devices is well known in the art. However, other wireless communication protocols such as IEEE 802.11 or Bluetooth® may be used. Additionally, the set of commands codes can be sent over a wired connection such as FireWire, USB, Ethernet or coaxial cable. Moreover, the set of command codes can comprise other transmission formats, such as serial (RS-232) data codes.

A detailed description of control information, which includes codes and metadata, as well as a system, method, and apparatus for using and accessing control information to control CE devices is provided in the parent U.S. patent application Ser. No. 10/783,017 to Krzyzanowski et al., filed Feb. 23, 2004 and entitled "Device Control System, Method, and Apparatus," the entirety of which is incorporated by reference as if fully set forth herein.

Figure 2:
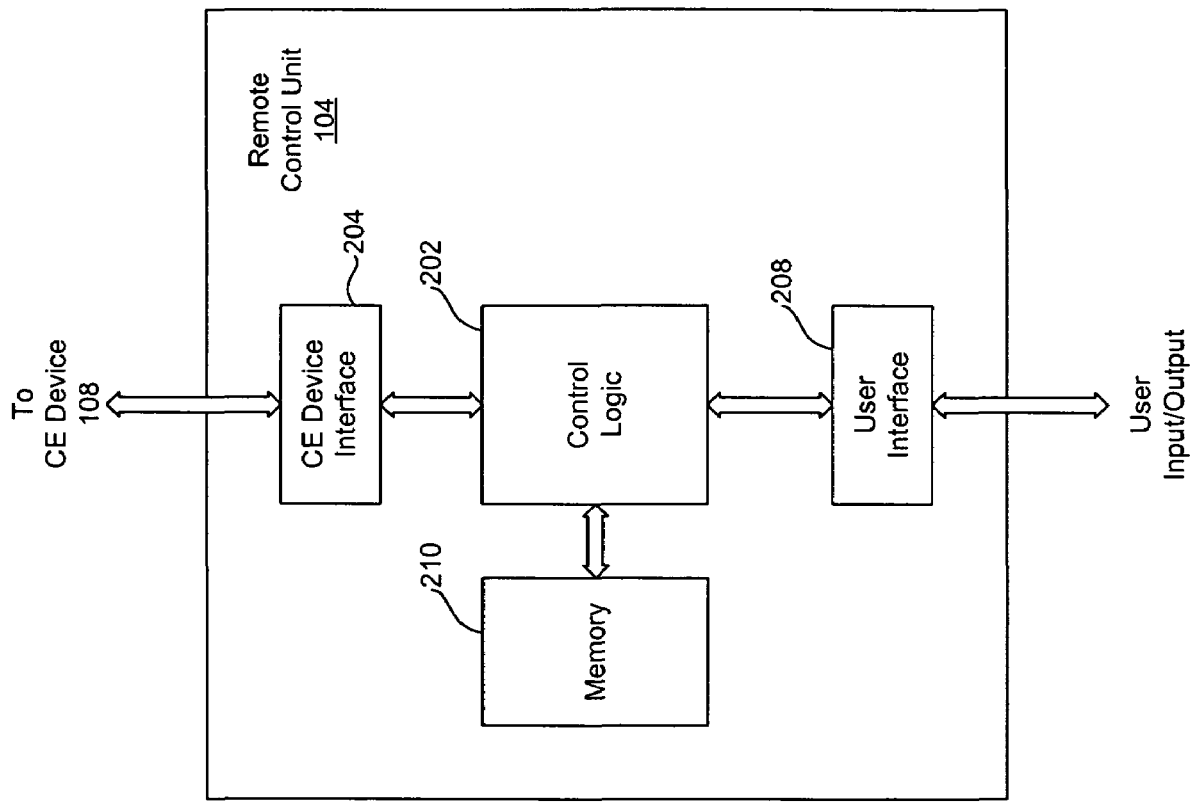
FIG. 2 is a depiction of the functional elements of an exemplary remote control unit in accordance with an embodiment of the present invention.

FIG. 2 depicts the functional elements of an example remote control unit 104 in accordance with an embodiment of the present invention. Remote control unit 104 may comprise a personal digital assistant (PDA) or web-pad, although the invention is not so limited. As shown in FIG. 2, remote control unit 104 includes a user interface 208 for receiving user input and providing information to a user, and a CE device interface 204 for transmitting information to, and optionally receiving information from, a CE device. In an embodiment, user interface 208 comprises a graphical user interface (GUI) that receives user input via a touch-sensitive display, and CE device interface 204 comprises a one-way IR transmitter or, alternately, a two-way IR transceiver.

In an alternate embodiment, CE device interface 204 comprises a WiFi transmitter or transceiver adapted for communication in accordance with an IEEE 802.11 protocol. Where the CE device interface 204 is implemented in this fashion, and the CE device to be controlled is adapted to perform IR communication only, an intermediate device is necessary for converting between 802.11 and IR communication protocols. A bridge device that facilitates such communication between an 802.11-compliant control device and a CE device that communicates using an IR link is described in commonly-owned co-pending U.S. patent application Ser. No. 10/387,590 to Krzyzanowski et al., filed Mar. 14, 2003 and entitled "Legacy Device Bridge for Residential or Non-Residential Networks," the entirety of which is incorporated by reference as if fully set forth herein.

As shown in FIG. 2, remote control unit 104 further includes control logic 202, which is communicatively coupled to user interface 208 and CE device interface 204. Control logic 202 is adapted to execute features of the present invention as will be described in more detail herein, including but not limited to processing user input received from user interface 208 and transmitting command codes to a CE device via CE device interface 204. As will be appreciated by persons skilled in the relevant art(s) based on the teachings provided herein, control logic 202 may be readily implemented in hardware, software, or as combination of hardware and software. For example, control logic 202 may be implemented using a central processing unit (CPU) and program code that is configured to execute on the CPU.

Remote control unit 104 also includes a memory 210 that is communicatively coupled to control logic 202. Memory 210 may be used to store the local user database 102, described above in reference to FIG. 1. Accordingly, memory 210 may be used to store control information for a variety of CE devices, including CE devices 106, 108, and 110. Furthermore, memory 210 may be used to store the embedded CEDB 112 when present as described in reference to FIG. 1. Alternatively, embedded CEDB 112, when present, may be stored in a second memory component (not shown).

In yet another alternative embodiment, the remote control unit 104 may further include an external interface (not shown) for providing access to a network or to an external storage medium. In such an embodiment, the interface may be used to access the external CEDB 114 as described in reference to FIG. 1.

Figure 3:
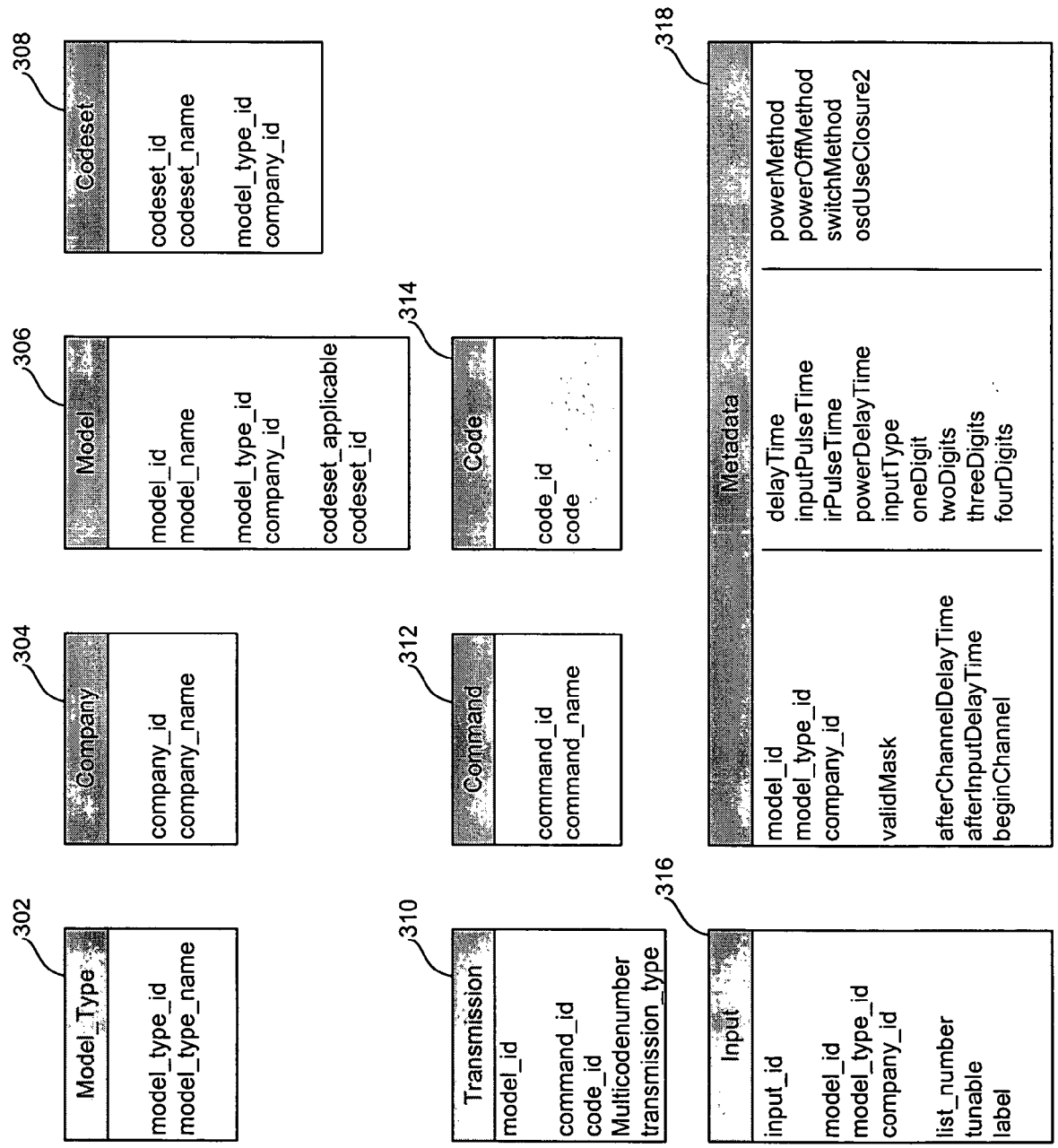
FIG. 3 is a depiction of an exemplary organization of data for a Consumer Electronic Device Control Database (CEDB) in accordance with the present invention.

FIG. 3 is a depiction of an exemplary organization of data for a Consumer Electronic Device Control Database (CEDB). In the embodiment depicted in FIG. 3, information for controlling a variety of CE devices are organized into nine tables comprising a Model_Type table 302, a Company table 304, a Model table 306, a Codeset table 308, a Transmission table 310, a Command table 312, a Code table 314, an Input table 316, and a Metadata table 318. Each table contains one or more records. A record contains one or more related data elements.

The Model_Type table 302 contains records describing various types of CE devices. A Model_Type record contains a model_type_id and a model_type_name data elements. Each Model_Type record includes a model_type_id value that is unique among all other Model_Type records. Hence, the model_type_id value can be used to uniquely identify a Model_Type record. A model_type_name data element holds a description of a CE device type. FIG. 4A depicts an exemplary Model_Type table having 6 records. As depicted in FIG. 4A, example values of model_type_name include DVD, CD, Receiver, VCR, etc.

The Company table 304 contains records describing various companies that market CE devices. A Company record contains a company_id and a company_name data elements. Each Company record includes a company_id value that is unique among all other Company records. Hence, the company_id value can be used to uniquely identify a Company record. A company_name data element holds a description of a company name or a brand name of a CE device. FIG. 4B depicts an exemplary Company table having 6 records. As depicted in FIG. 4B, example values of company_name include Sony, Panasonic, Toshiba, etc.

The Codeset table 308 contains records describing various codesets. A codeset identifies a set of commands that can be used to control numerous CE device models of a specific type and brand. A Codeset record contains a codeset_id, codeset_name, model_type_id, and company_id. Each Codeset record contains a codeset_id value that is unique among all other Codeset records. Hence, the codeset_id value can be used to uniquely identify each Codeset record. A codeset_name data element holds a description of a codeset.

A model_type_id in a Codeset record contains a value that matches a model_type_id value in one of the Model_Type records. Hence, Codeset records and Model_Type records are interrelated through the model_type_id data element. For each Codeset record, a corresponding unique Model_Type record can be found with a matching model_type_id value. For each Model_Type record, zero or more Codeset records can be found with a matching model_type_id value.

A company_id in a Codeset record contains a value that matches a company_id value in one of the Company records. Hence, Codeset records and Company records are interrelated through the company_id data element. For each Codeset record, a corresponding unique Company record can be found with a matching company_id value. For each Company record, zero or more Codeset records can be found with a matching company_id value.

FIG. 4C depicts an exemplary Codeset table having 6 records. As depicted in FIG. 4C, example values of codeset_name include Generic ABC cable 1, Generic Toshiba tv 1, etc. Furthermore, for the exemplary record having a codeset_name value of Generic Toshiba tv 1, model_type_id is 4 and corresponds to the Model_Type record with model_type_name of tv in FIG. 4A, and company_id is 3 and corresponds to the Company record with company_name of Toshiba in FIG. 4B.

The Model table 306 contains records describing various CE device models. A Model record contains a model_id, model_name, model_type_id, company_id, codeset_applicable, and codeset_id data elements. Each Model record contains a model_id value that is unique among all other Model records. Hence, the model_id value can be used to uniquely identify each Model record. A model_name data element holds a description of a model name.

A model_type_id in a Model record contains a value that matches a model_type_id value in one of the Model_Type records. Hence, Model records and Model_Type records are interrelated through the model_type_id data element. For each Model record, a corresponding unique Model_Type record can be found with a matching model_type_id value. For each Model_Type record, zero or more Model records can be found with a matching model_type_id value.

A company_id in a Model record contains a value that matches a company_id value in one of the Company records.

Hence, Model records and Company records are interrelated through the company_id data element. For each Model record, a corresponding unique Company record can be found with a matching company_id value. For each Company record, zero or more Model records can be found with a matching company_id value.

A codeset_applicable data element, when set to true, indicates that a Model record describes a CE device that uses a codeset. When codeset_applicable is set to true, the codeset_id of the Model record is valid. A codeset_id in a Model record contains a value that matches a codeset_id value in one of the Codeset records. Hence, Model records and Codeset records are interrelated through codeset_applicable and codeset_id data elements. For each Model record having a valid codeset_id, a corresponding unique Codeset record can be found with a matching codeset_id value. For each Codeset record, zero or more Model records can be found with a matching codeset_id value.

FIG. 4D depicts an exemplary Model table having 6 records. As depicted in FIG. 4D, example values of model_name include CE19H15, 14AF43, 14AF44, etc. Furthermore, for the exemplary record having a model_name value of 14AF44, model_type_id is 4 and corresponds to the Model_Type record with model_type_name of tv in FIG. 4A, company_id is 3 and corresponds to the Company record with company_name of Toshiba in FIG. 4B, codeset_applicable is 1 to indicate that codeset_id value is valid, and codeset_id is 6 and corresponds to the Codeset record with codeset_name of Generic Toshiba tv 1 in FIG. 4C.

The Command table 312 contains records describing various command codes that may be applied to CE devices. A Command record contains a command_id and a command_name data elements. Each Command record includes a command_id value that is unique among all other Command records. Hence, the command_id value can be used to uniquely identify a Command record. A command_name data element holds a description of a command code. FIG. 4E depicts an exemplary Command table having 6 records. As depicted in FIG. 4E, example values of command_name include channel_down, channel_up, mute, volume_down, etc.

The Code table 314 contains records describing various codes used for controlling CE devices. A Code record contains a code_id and a code data elements. Each Code record includes a code_id value that is unique among all other Code records. Hence, the code_id value can be used to uniquely identify a Code record. A code data element holds a description of a code. FIG. 4F depicts an exemplary Code table having 9 records.

The Transmission table 310 contains records describing a command code that should be transmitted to execute a specific command on a specific CE device model. A Transmission record contains a transmission_type, model_id, command_id, code_id, and multicodenumber data elements.

A transmission_type in at Transmission record contains a value that indicates the format type of the command code to be transmitted, e.g, a "1" for IR and a "2" for serial. A model_id in a Transmission record contains a value that matches one of a model_id value in one of the Model records or a codeset_id value in one of the Codeset records. Hence, Transmission records, Model records, and Codeset records are interrelated through the model_id and codeset_id data elements. For each Transmission record, a single record from either the Model table or the Codeset Table can be found with a model_id value or a codeset_id value that matches the model_id value of the Transmission record. For each model_id value of a Model record and codeset_id value of a Codeset record, one or more Transmission records can be found with a matching model_id value.

A command_id in a Transmission record contains a value that matches a command_id value in one of the Command records. Hence, Transmission records and Command records are interrelated through the command_id data element. For each Transmission record, a corresponding unique Command record can be found with a matching command_id value. For each Command record, zero or more Transmission records can be found with a matching command_id value.

A code_id in a Transmission record contains a value that matches a code_id value in one of the Code records. Hence, Transmission records and Code records are interrelated through the code_id data element. For each Transmission record, a corresponding unique Code record can be found with a matching code_id value. For each Code record, zero or more Transmission records can be found with a matching code_id value.

Each Transmission record provides a mapping between a particular model_id and command_id combination with a code_id. A code_id is used to identify a code value from the Code table that should be transmitted to execute the command code specified by the command_id on a CE device specified by the model_id. When multiple Transmission records are present in the Transmission table for a specific model_id and command_id combination, executing the command code specified by the command_id on the CE device model specified by the model_id requires transmitting multiple codes. In such circumstances, multicodenumber in the Transmission records are used to determine the sequence in which codes should be transmitted to execute the specified command code.

FIG. 4G depicts an exemplary Transmission record table having 6 records. The transmission_type value of 1 indicates that the command code is in IR format. As depicted in FIG. 4G, there are two Transmission records having a model_id value of 1002 and command_id of 2. A model_id value of 1002 in the Transmission record of FIG. 4G corresponds to a Toshiba television model 14AF43 as indicated by a matching record containing a model_id value of 1002 in the Model table of FIG. 4D. A command_id value of 2 represents a channel_up command code as indicated by a corresponding record in the Command table of FIG. 4E. Since there are two Transmission records for model_id value of 1002 and command_id of 2, the execution of a channel_up command on the Toshiba television model 14AF43 requires the transmission of the two codes specified by the two Transmission records. Furthermore, the codes specified by the two Transmission records are required to be transmitted in the sequence designated by each record's multicodenumber. Hence, the code associated with code_id value of 3 should be transmitted first followed by the code associated with code_id value of 4 to execute a channel_up command code on a Toshiba television model 14AF43.

Furthermore, as depicted in FIG. 4G, there is only a single Transmission record having a model_id value of 6 and command_id of 3. A model_id value of 6 in the Transmission record of FIG. 4G corresponds to any CE device utilizing the codeset named Generic Toshiba tv 1 as indicated by a matching record containing a codeset_id value of 6 in the Codeset table of FIG. 4C. A command_id value of 3 represents a mute command code as indicated by a corresponding record in the Command table of FIG. 4E. Since there is only one Transmission record for a model_id value of 6 and a command_id of 3, the execution of a mute command on any CE device using the Generic Toshiba tv 1 codeset requires the transmission of only a single code designated by the code_id of the Transmission record. Hence, the code associated with code_id of value 2 in the Code table of FIG. 4F should be transmitted in executing a mute command code on any CE device utilizing the Generic Toshiba tv 1 codeset.

The Input table 316 contains records describing various inputs of CE devices. An Input record contains an input_id, model_id, model_type_id, company_id, list_number, tunable and label data elements. Each Input record contains an input_id value that is unique among all other Input records. Hence, the input_id value can be used to uniquely identify each Input record. A label data element holds a description of an input. A tunable data element indicates whether the input is capable of being tuned to different channels.

A model_id in an Input record contains a value that matches a model_id value in one of the Model records. Hence, Input records and Model records are interrelated through the model_id data element. For each Input record, a corresponding unique Model record can be found with a matching model_id value. For each Model record, zero or more Input records can be found with a matching model_id value.

A model_type_id in an Input record contains a value that matches a model_type_id value in one of the Model_Type records. Hence, Input records and Model_Type records are interrelated through the model_type_id data element. For each Input record, a corresponding unique Model_Type record can be found with a matching model_type_id value. For each Model_Type record, zero or more Input records can be found with a matching model_type_id value.

A company_id in an Input record contains a value that matches a company_id value in one of the Company records. Hence, Input records and Company records are interrelated through the company_id data element. For each Input record, a corresponding unique Company record can be found with a matching company_id value. For each Company record, zero or more Input records can be found with a matching company_id value.

For CE device models that are capable of receiving a signal from multiple inputs, the Input table contains a record for each input. If the selection of the input is performed by cycling through the inputs, the list_number data element indicates the ordering in which the inputs are cycled.

FIG. 4H depicts an exemplary Input table having 6 records. As depicted in FIG. 4H, there are three Input records having a model_id value of 1002. A model_id value of 1002 represents a Toshiba television model 14AF43 as indicated by a corresponding record in the Model table. These Input records indicate that a Toshiba television model 14AF43 has three inputs. The first input has a label value of TV, the second input has a label value of video1 and the third input has a label value of video2. As indicated by the tunable data element of the three records, only the TV input can be tuned to different channels. If the inputs on the Toshiba television model 14AF43 can be selected by cycling through the inputs, then the inputs are cycled in the sequence of TV, video1, and video2 as designated by the list_number data element.

The Metadata table 318 contains records describing control behaviors of CE devices. A Metadata record contains a model_id, a model_type_id, a company_id, a validMask, an afterChannelDelayTime, an afterInputDelayTime, a beginChannel, a delayTime, an inputPulseTime, an irPulseTime, a powerDelayTime, an inputType, a oneDigit, a twoDigits, a threeDigits, a fourDigits, a powerMethod, a powerOffMethod, a switchMethod, an osdUseInputIRAsClosure and an osdUseClosure2 data elements. FIG. 4I depicts an exemplary Metadata table having 2 records.

A model_id in a Metadata record contains a value that matches a model_id value in one of the Model records. Hence, Metadata records and Model records are interrelated through the model_id data element. For each Metadata record, a Model record can be found with a matching model_id value. For each Model record, a Metadata record can be found with a matching model_id value.

A model_type_id in a Metadata record contains a value that matches a model_type_id value in one of the Model_Type records. Hence, Metadata records and Model_Type records are interrelated through the model_type_id data element. For each Metadata record, a corresponding unique Model_Type record can be found with a matching model_type_id value. For each Model_Type record, zero or more Metadata records can be found with a matching model_type_id value.

A company_id in a Metadata record contains a value that matches a company_id value in one of the Company records. Hence, Metadata records and Company records are interrelated through the company_id data element. For each Metadata record, a corresponding unique Company record can be found with a matching company_id value. For each Company record, zero or more Metadata records can be found with a matching company_id value.

A validMask contains information indicating whether data elements in a Metadata record are valid. When a data element is invalid, a default value may be used in its place. For example, the validMask may indicate for a particular Metadata record that its inputPulseTime data element is invalid and therefore a default value should be used instead. Likewise, the validMask in a Metadata record may indicate that its beginChannel data element is valid and therefore the value of it beginChannel data element should be relied upon in controlling the CE device associated with the Metadata record.

An afterChannelDelayTime indicates the wait time required between a transmission of a command code to change a channel and a transmission of a subsequent command code to a CE device.

An afterInputDelayTime indicates the wait time required between a transmission of a command code to change an input and a transmission of a subsequent command code to a CE device.

A beginChannel indicates the channel from which input cycling starts on a CE device. Hence, a beginChannel value of 2 indicates that in order to cycle among the different inputs of a CE device, the CE device should first be tuned to channel 2 and then cycling commands, such as channel down commands, should be transmitted to cycle through the inputs.

A delayTime indicates a default wait time required between transmissions of any two command codes to a CE device.

An inputPulseTime indicates the length of time an input command code should be transmitted to a CE device.

An irPulseTime indicates the default length of time a command code should be transmitted to a CE device.

A powerDelayTime indicates the wait time required between a transmission of a power on command and a transmission of a subsequent command code to a CE device.

An inputType indicates the mechanism by which a CE device selects an input. An inputType, for example, may be one of the following values: never, discrete, cycle, on screen display (OSD), via channel, mode toggle or two cycles. An inputType value of never indicates that the CE device does not support input selection. An inputType value of discrete indicates that the input is selected by transmitting a specific command code for each input. An inputType value of cycle indicates that the inputs are selected by transmitting a command code to cycle through the various inputs. An inputType value of OSD indicates that the inputs of a CE device are selected through an on screen display menu and therefore commands controlling the OSD should be used to select an input. An inputType value of via channel indicates that the CE device should first be tuned to a specific channel before cycling through the inputs. An inputType value of mode toggle indicates that a CE device needs to be switched into an input cycling mode before switching inputs. An inputType value of two cycles indicates that two separate sets of input cycling commands are available to switch among all the inputs. For example, one set of cycling commands may cycle through auxiliary 1, auxiliary 2, and auxiliary 3 inputs while another set of cycling commands may cycle through tuner, video 1, and video 2 inputs.

A oneDigit indicates the mechanism by which a CE device tunes to a channel represented by a single digit. A oneDigit, for example, may be one of the following values: cannot, oneDigit, prependZero, multiplePrependZero, useEnter, or dashesPersistent. A oneDigit value of cannot indicates that the CE device cannot be tuned to a channel having only a single digit. A oneDigit value of oneDigit indicates that a one-digit channel is tuned by transmitting a command code for the single digit identifying the channel. A oneDigit value of prependZero indicates that a one-digit channel is tuned by transmitting a command code for a single digit 0 before transmitting a command code for the single digit identifying the channel. A oneDigit value of multiplePrependZero indicates that a one-digit channel is tuned by transmitting a command code for a digit 0 multiple times before transmitting a command code for the single digit identifying the channel. The number of times a digit 0 is transmitted is based on the values of the threeDigit and fourDigit data elements. If the threeDigit value is cannot, a digit 0 is transmitted only once. If the threeDigit value is something other than cannot and the fourDigit value is cannot, then a digit 0 is transmitted twice. If both threeDigit and fourDigit values are not cannot, then a digit 0 is transmitted three times. A oneDigit value of useEnter indicates that a one-digit channel is tuned by transmitting a command code for the single digit identifying the channel followed by a transmission of an enter command code. A oneDigit value of dashesPersistent indicates that the CE device can be toggled between a mode for selecting one-digit channels and two-digit channels. Hence, when oneDigit value is dashesPersistent, the CE device must first be placed in the one-digit channel selection mode by transmitting, if necessary, a command code to change the mode before transmitting a command code to tune the channel.

A twoDigit indicates the mechanism by which a CE device tunes to a channel represented by two digits. A twoDigit, for example, may be one of the following values: cannot, twoDigit, prependZero, multiplePrependZero, useEnter, plus10, dashes, or dashesPersistent. A twoDigit value of cannot indicates that the CE device cannot be tuned to a channel identified by two digits. A twoDigit value of twoDigit indicates that a two-digit channel is tuned by transmitting command codes for the two digits identifying the channel. A twoDigit value of prependZero indicates that a two-digit channel is tuned by transmitting a command code for a single digit 0 before transmitting command codes for the two digits identifying the channel. A twoDigit value of multiplePrependZero indicates that a two-digit channel is tuned by transmitting a command code for a digit 0 multiple times before transmitting command codes for the two digits identifying the channel. The number of times a digit 0 is transmitted is based on the value of the fourDigit data element. If the fourDigit value is cannot, then a digit 0 is transmitted once. If the fourDigit value is something other than cannot, then a digit 0 is transmitted twice. A twoDigit value of useEnter indicates that a two-digit channel is tuned by transmitting command codes for the two digits identifying the channel followed by a transmission of an enter command code. A twoDigit value of plus10 indicates that a two-digit channel is tuned by transmitting a command code for a 10 or 10+ key before transmitting command codes for the two digits identifying the channel. A twoDigit value of dashes indicates that a two-digit channel is tuned by transmitting a command code to place the CE device in a two-digit input mode before transmitting command codes for the two digits identifying the channel. A twoDigit value of dashesPersistent indicates that the CE device can be toggled between a mode for selecting one-digit channels and two-digit channels. Hence, when twoDigit value is dashesPersistent, the CE device must first be placed in the two-digit channel selection mode by transmitting, if necessary, a command code to change the mode before transmitting command codes to tune a two-digit channel.

A threeDigit indicates the mechanism by which a CE device tunes to a channel represented by three digits. A threeDigit, for example, may be one of the following values: cannot, threeDigit, useEnter, or plus100. A threeDigit value of cannot indicates that the CE device cannot be tuned to a channel identified by three digits. A threeDigit value of threeDigit indicates that a three-digit channel is tuned by transmitting command codes for the three digits identifying the channel. A threeDigit value of useEnter indicates that a three-digit channel is tuned by transmitting command codes for the three digits identifying the channel followed by a transmission of an enter command code. A threeDigit value of plus100 indicates that a three-digit channel is tuned by transmitting a command code for a 100 or 100+ key before transmitting command codes for the three digits identifying the channel.

A fourDigit indicates the mechanism by which a CE device tunes to a channel represented by four digits. A fourDigit, for example, may be one of the following values: cannot, fourDigit, or useEnter. A fourDigit value of cannot indicates that the CE device cannot be tuned to a channel identified by four digits. A fourDigit value of fourDigit indicates that a four-digit channel is tuned by transmitting command codes for the four digits identifying the channel. A fourDigit value of useEnter indicates that a four-digit channel is tuned by transmitting command codes for the four digits identifying the channel followed by a transmission of an enter command code.

A powerMethod indicates the mechanism by which a CE device is turned on. A powerMethod, for example, may be one of the following values: toggle, discrete, numeric, or navigational. A powerMethod value of toggle indicates that a CE device is turned on by transmitting a command code to toggle between on and off states. A powerMethod value of discrete indicates that a CE device is turned on by transmitting a specific power on command code. A powerMethod value of numeric indicates that a CE device may be turned on by transmitting a command code corresponding to any numeric key. A powerMethod value of navigational indicates that a CE device may be turned on by transmitting a command code corresponding to a navigational function such as play.

A powerOffMethod indicates the mechanism by which a CE device is turned off. A powerOffMethod, for example, may be one of the following values: toggle or discrete. A powerOffMethod value of toggle indicates that a CE device is turned off by transmitting a command code to toggle between on and off states. A powerOffMethod value of discrete indicates that a CE device is turned off by transmitting a specific power off command code.

A switchMethod is applicable for only combo devices that include two or more CE devices as sub-components. For example a combo CE device may include both a television and a DVD player in a singe unit. The switchMethod indicates the mechanism by which sub-component CE devices are selected to receive command codes. A switchMethod, for example, may be one of the following values: discrete, cycle, or full. A switchMethod value of discrete indicates that a sub-component CE device is selected by transmitting a specific command code for each sub-component CE device. A switchMethod value of cycle indicates that a sub-component CE device is selected by transmitting a command code to cycle through the various sub-component CE devices. A switchMethod of full indicates that a selection of a sub-component is not necessary and all sub-components can receive command codes without first being selected.

An osdUseInputIRAsClosure data element, when set to true, indicates that a CE device uses an on-screen-display menu for selecting inputs and that the on-screen-display menu, once enabled, can be closed by transmitting a command code for the particular input that is desired to be selected.

An osdUseClosure2 data element, when set to true, indicates that for a CE device that uses an on-screen-display menu, the on-screen-display, once enabled, is closed by transmitting a specific command code for closing the on-screen-display.

Although FIG. 3 depicts an exemplary organization of data for a Consumer Electronic Device Control Database (CEDB) into tables and records, the invention is not so limited. Furthermore, the data may be organized into fewer or more tables. For example, the IR table, Command table, and Code table may be combined to form a single table containing records that capture all the information previously provided in the three tables separately. Furthermore, the data may be represented in structures other than tables. For example, data may be organized using an XML format. FIG. 5 depicts an exemplary XML format for organizing control information for a CE device. As would be appreciated by a person skilled in the art, various formats may be used to organize data for a Consumer Electronic Device Control Database (CEDB).

Figure 6:
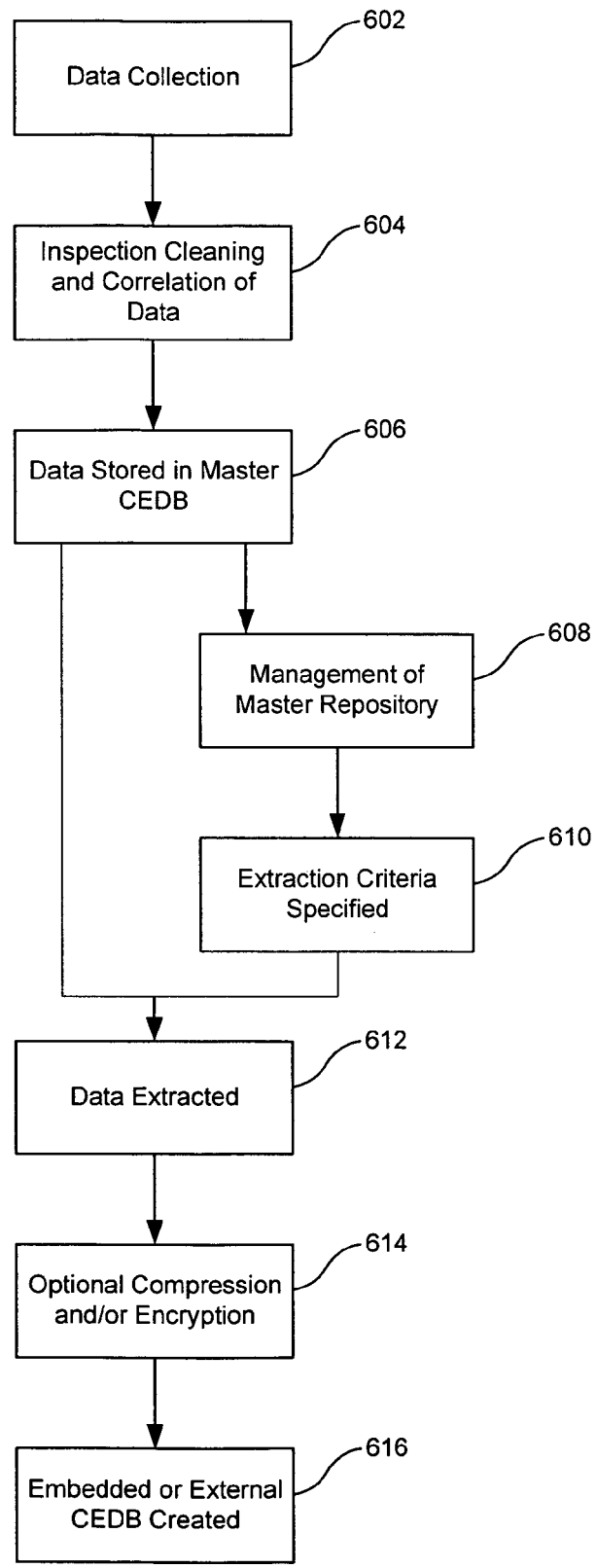
FIG. 6 is a flow chart depicting an exemplary process of producing a CEDB in accordance with the present invention.

FIG. 6 is a flow chart depicting an exemplary process of producing a CEDB. In step 602, data for a CEDB is collected, for example, by examining a CE device manual, using a CE device, scraping the signals transmitted between a CE device and the CE device provided remote control unit, and by receiving input from end users. In step 604, the collected data is inspected, cleaned and correlated with specific CE devices. In step 606, the data is stored in a master repository to form a master CEDB. In step 608, the master CEDB can be inspected and managed, for example, using a web-based user interface. In step 610, an extraction criteria can be specified to select a subset of CE devices from the master CEDB. In step 612, data for all or the subset of CE devices specified by the extraction criteria is extracted. In step 614, the extracted data is optionally compressed and/or encrypted. In step 616, the extracted data is used to create an embedded or external CEDB that can be used with a remote control unit in accordance with the present invention.

Figure 7A:
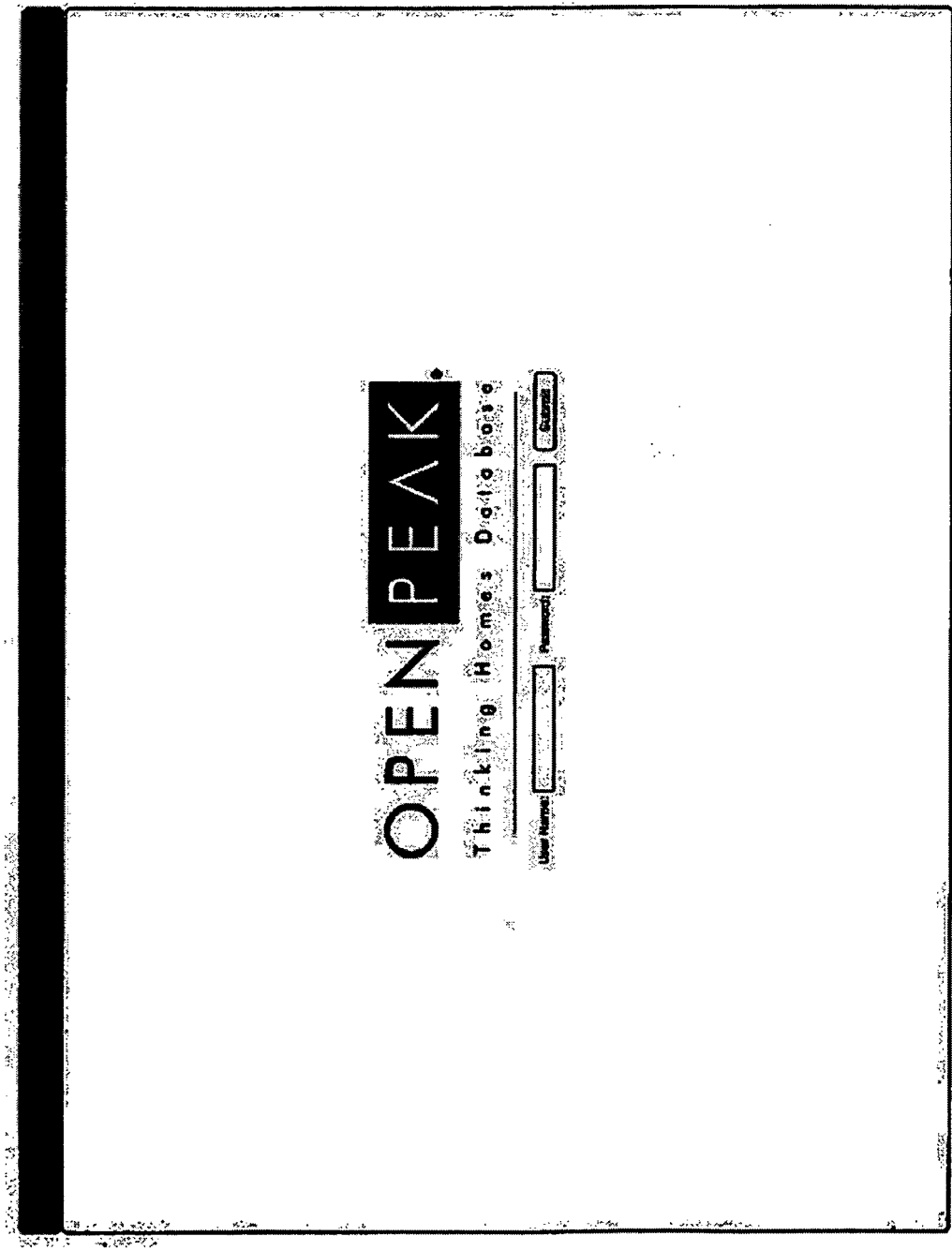
FIGS. 7A-7C are depictions of an exemplary interface for inspecting and managing a web accessible CEDB in accordance with the present invention.
Figure 7B:
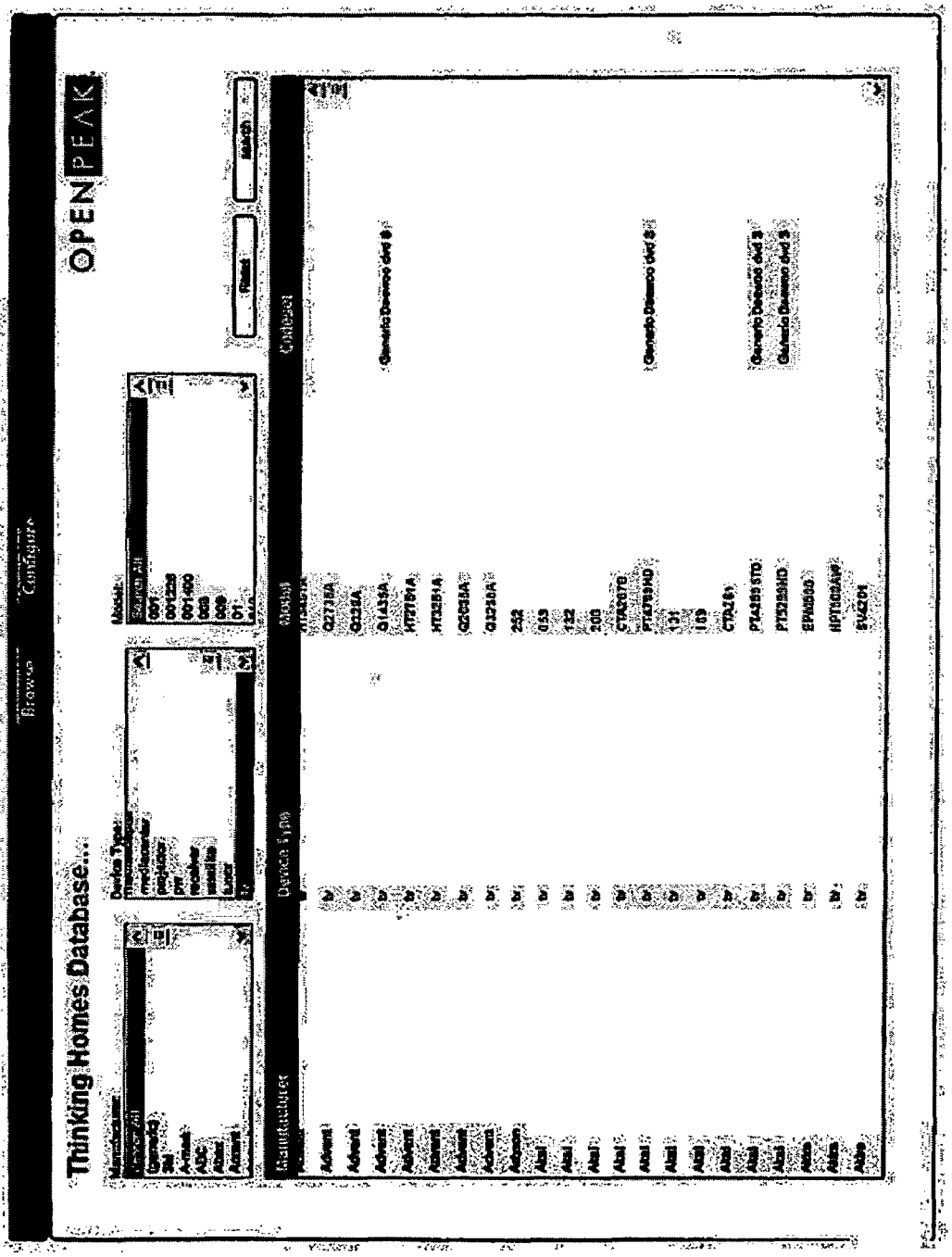
Figure 7C:
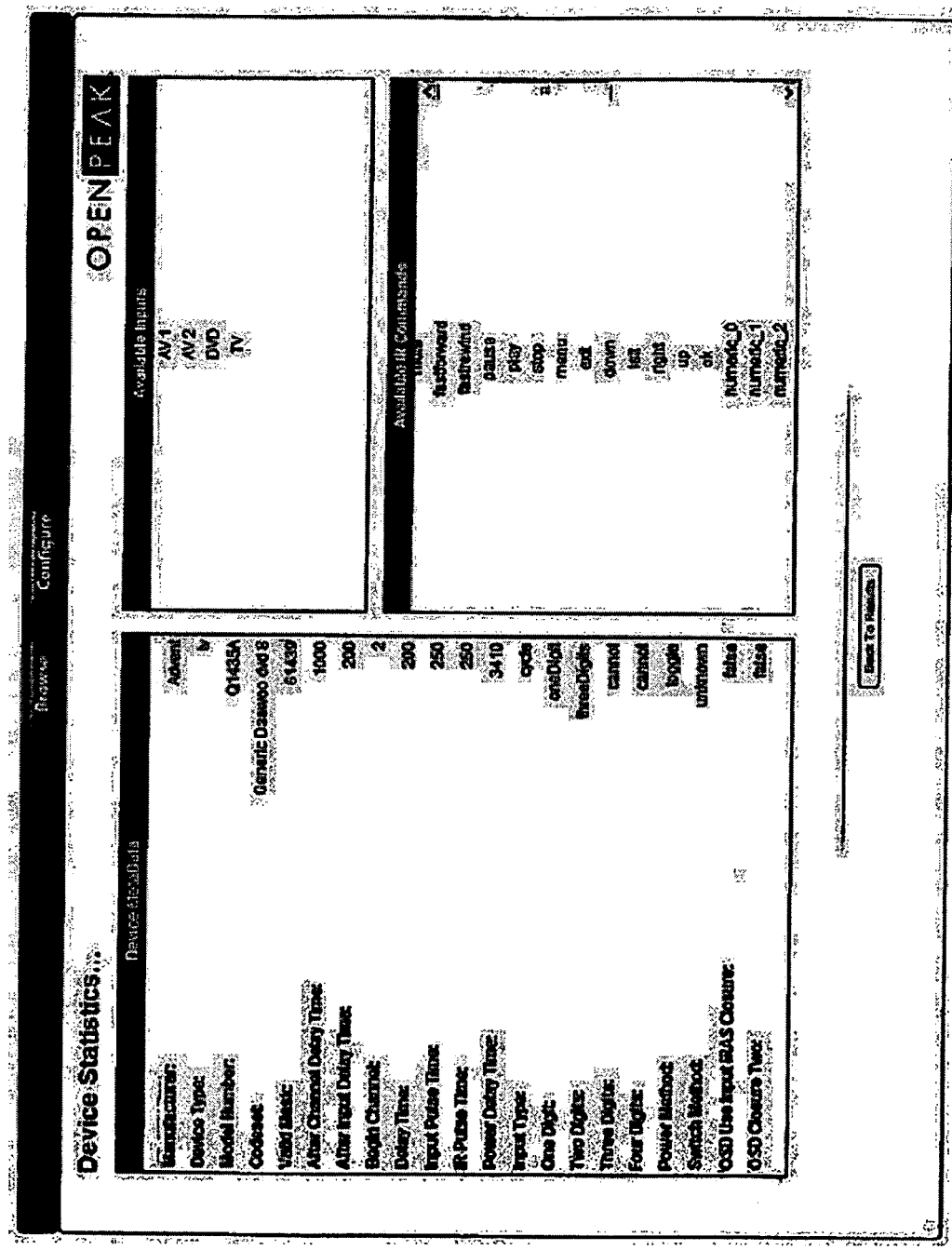

FIGS. 7A-7C are depictions of an exemplary user interface for inspecting and managing a web accessible CEDB that can be utilized, for example, in step 608. FIG. 7A is a depiction of an exemplary user login screen to limit access to a CEDB. FIG. 7B is a depiction of an exemplary user interface to browse the various CE devices for which control information is available in the CEDB. FIG. 7C is a depiction of an exemplary user interface to browse control information for a specific CE device.

Figure 8A:
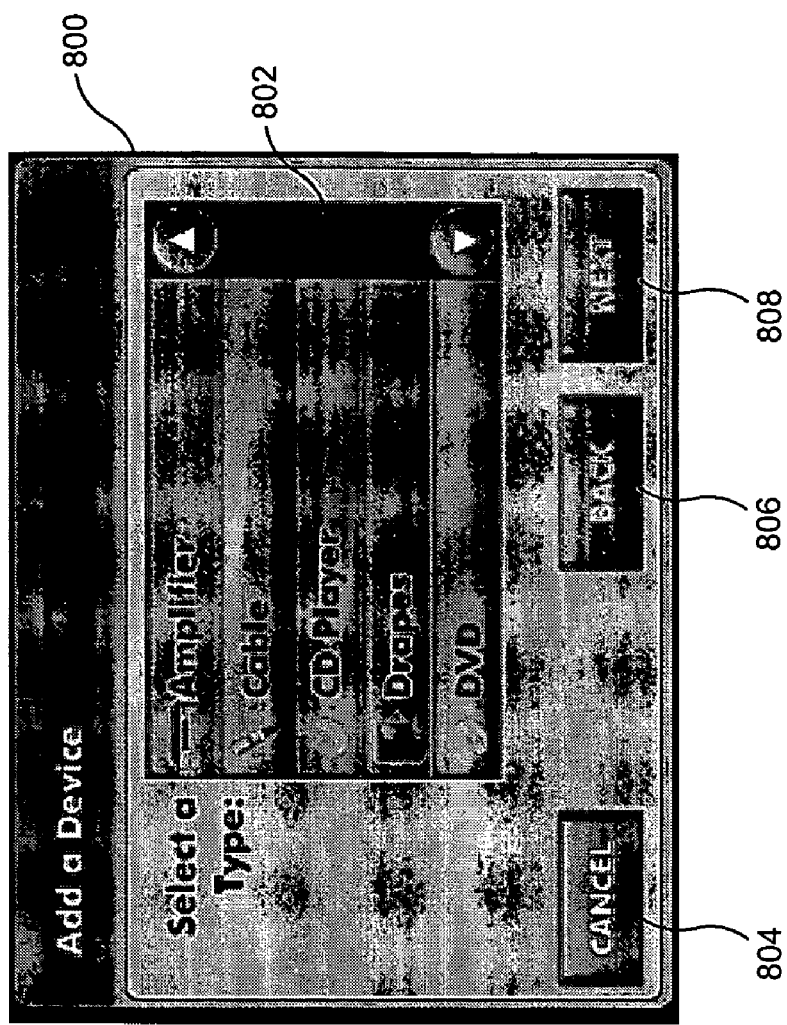
FIG. 8A-8C are depictions of an exemplary interface for configuring a remote control unit with data from a CEDB in accordance with the present invention.
Figure 8B:
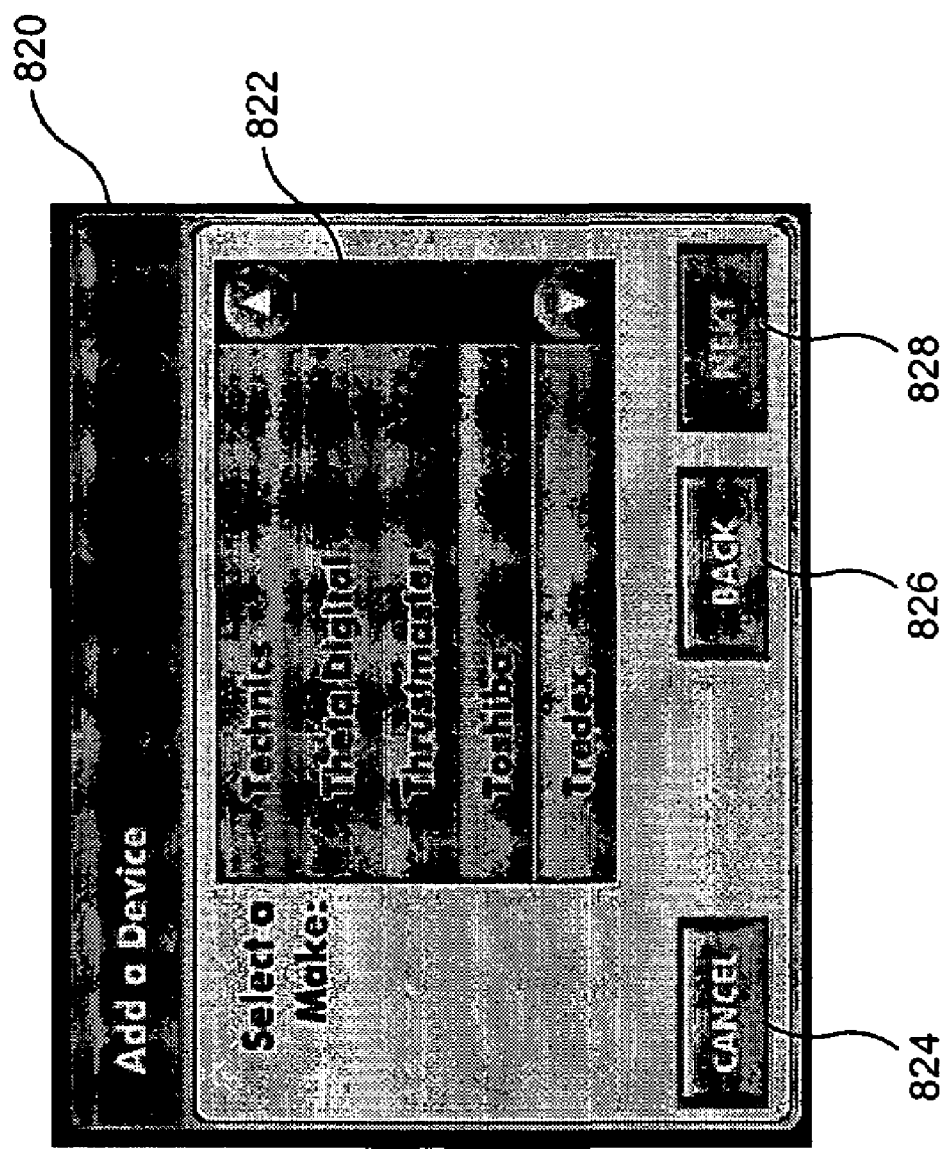
Figure 8C:
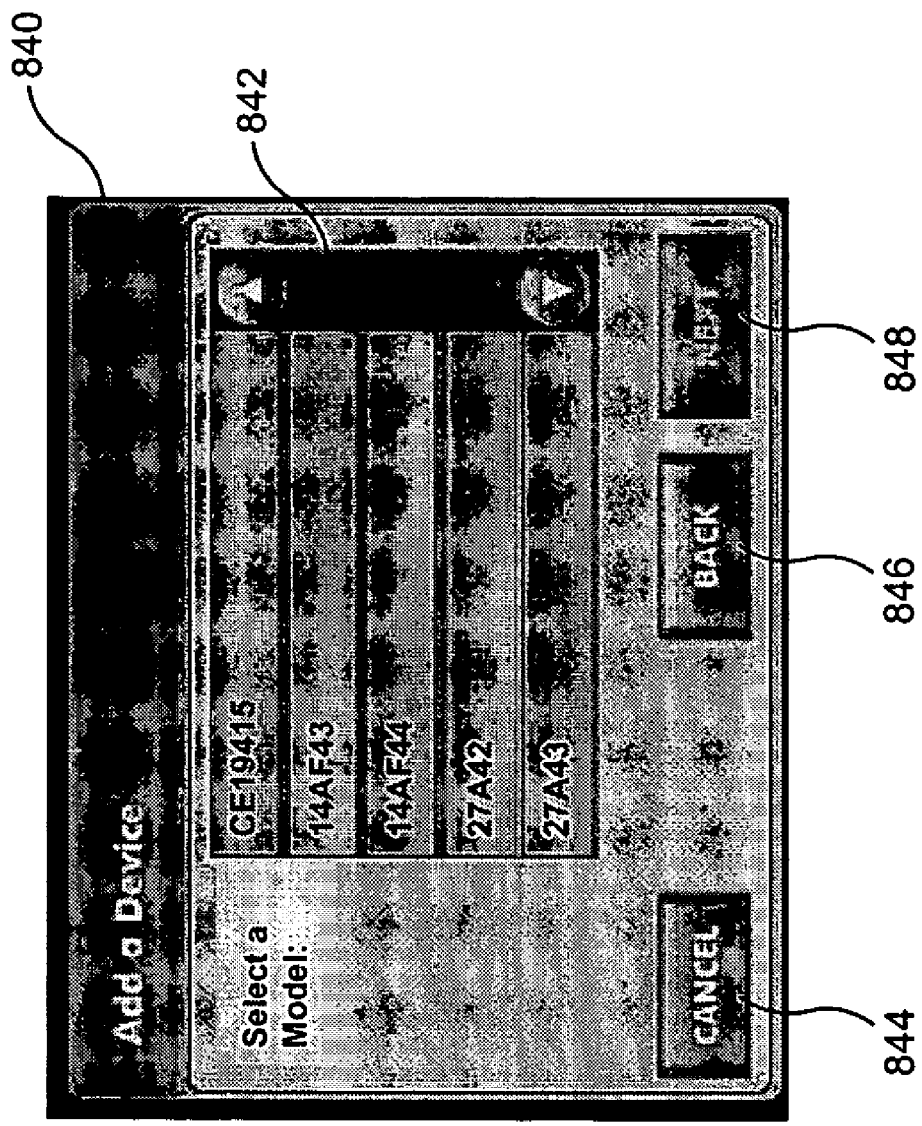

FIGS. 8A-8C are depictions of an exemplary user interface for configuring a remote control unit to control a CE device, in accordance with the present invention. The exemplary interfaces as depicted in FIGS. 8A-8C can be used, for example, as part of the user interface 208 on the remote control unit 104.

FIG. 8A depicts an exemplary interface 800 for allowing a user to select among a set of CE device model types. The interface 800 includes a model type list 802, cancel button 804, back button 806, and next button 808. Initially, the next button 808 is deactivated so that it cannot be depressed. The cancel button 804 and back button 806 allow the user to exit the interface 800 and cancel the configuration process. List 802 displays a list of CE device model types available in a CEDB. The list 802 is populated by retrieving the Model_Type records from the CEDB and adding an entry in the list 802 for each model_type_name value in the retrieved Model_Type records. When a user selects an entry from the list 802, the next button 808 is activated and the model_type_id of the Model_Type record corresponding to the selected list entry is recorded as the selected model_type_id. When the user selects the next button 808, interface 800 is removed and an additional interface, such as interface 820 of FIG. 8B, is provided to continue the configuration process.

FIG. 8B depicts an exemplary interface 820 for allowing a user to select among a set of companies that produce CE devices of a model type previously selected by the user. The interface 820 includes a company list 822, cancel button 824, back button 826, and next button 828. Initially, the next button 828 is deactivated so that it cannot be depressed. The cancel button 824 allows a user to exit the interface 820 and cancel the configuration process. The back button 826 allows a user to go back to the previous user interface of the configuration process. List 822 displays a list of companies available in the CEDB that produce CE devices of a particular model type that the user had previously selected. The list 822 is populated by retrieving Company records having a model_type_id value that matches the selected model_type_id value chosen by the user in a previous user interface, such as interface 800 of FIG. 8A. For each retrieved Company record, an entry is added to the list 822 with the record's company_name value. When a user selects an entry from the list 822, the next button 828 is activated and the company_id of the Company record corresponding to the selected list entry is recorded as the selected company_id. When the user selects the next button 828, interface 820 is removed and an additional interface, such as interface 840 of FIG. 8C, is provided to continue the configuration process.

FIG. 8C depicts an exemplary interface 840 for allowing a user to select among a set of CE devices of a selected model type and make. The interface 840 includes a model list 842, cancel button 844, back button 846, and next button 848. Initially, the next button 848 is deactivated so that it cannot be depressed. The cancel button 844 allows a user to exit the interface 840 and cancel the configuration process. The back button 846 allows a user to go back to the previous user interface of the configuration process. List 842 displays a list of CE devices available in the CEDB of a particular model type and make that the user has previously selected. The list 842 is populated by retrieving Model records having a model_type_id value that matches a previously selected model_type_id value, such as with interface 800 of FIG. 8A, and having a company_id value that matches a previously selected company_id value, such as with interface 820 of FIG. 8B. For each retrieved Model record, an entry is added to the list 842 with the record's model_name value. When a user selects an entry from the list 842, the next button 848 is activated and the model_id of the Model record corresponding to the selected list entry is recorded as the selected model_id. When the user selects the next button 848, the remote control unit executing the interface 840 is configured to control the CE device corresponding to the selected model_id.

Once a CE device has been correlated to a unique model_id value in a CEDB, for example, through the use of interfaces 800, 820, and 840, a remote control unit, in an embodiment, is configured to control the CE device by copying all the records related to the model_id from the CEDB to the remote control unit's local user database. The copied records include all Input records, Metadata record, Transmission records, and Model record having a model_id value that matches the model_id value of the selected CE device. In addition, all Command records and Code records corresponding to each copied Transmission record are copied to the local user database. Furthermore, the Company record, Model_Type record, and Codeset record corresponding to the copied Model record is also copied to the local user database. Once the records are copied into the user local database, the user may modify the values in the records to customize the manner in which the CE device is controlled. The user may re-execute the configuration process to replace modified records with default records from the CEDB.

In an embodiment, a remote control unit, in accordance with the present invention, controls a CE device by accessing the records in its user local database corresponding to the model_id of the CE device. For example, a remote control unit may access the records in the following sequence to turn a CE device on and set its volume to mute. First, a Metadata record having a model_id matching the model_id value of the CE device is retrieved. The validMask and powerMethod data elements of the retrieved Metadata record are inspected to determine the proper method of turning the CE device on. Next, a Command record for the appropriate method of turning the CE device on is retrieved. With the command_id value of the retrieved Command record, one or more Transmission records having a matching command_id value and a model_id value matching the model_id value of the CE device are retrieved. For each code_id value of the one or more retrieved Transmission records, a corresponding Code record is retrieved and the code value of each retrieved Code record is transmitted to execute a power on command on the CE device. In transmitting the one or more code values to the CE device, other data elements from the retrieved Metadata and Transmission records may be examined such as irPulseTime and multicodenumber, respectively. Next, the amount of time specified in the powerDelayTime data element of the retrieved Metadata record is allowed to lapse to give the CE device a chance to turn on and become ready to receive new commands. To further set the CE device to mute, a Command record having a command_name value of mute is retrieved. Next, as outlined above, one or more Transmission records corresponding to the command_id value of the mute Command record and the model_id value of the CE device are retrieved as well as the corresponding Code records to transmit a mute command on the CE device. Thereafter, the amount of time specified in the delayTime data element of the retrieved Metadata record is allowed to lapse to give the CE device a chance to become ready to receive new commands.

Figure 9:
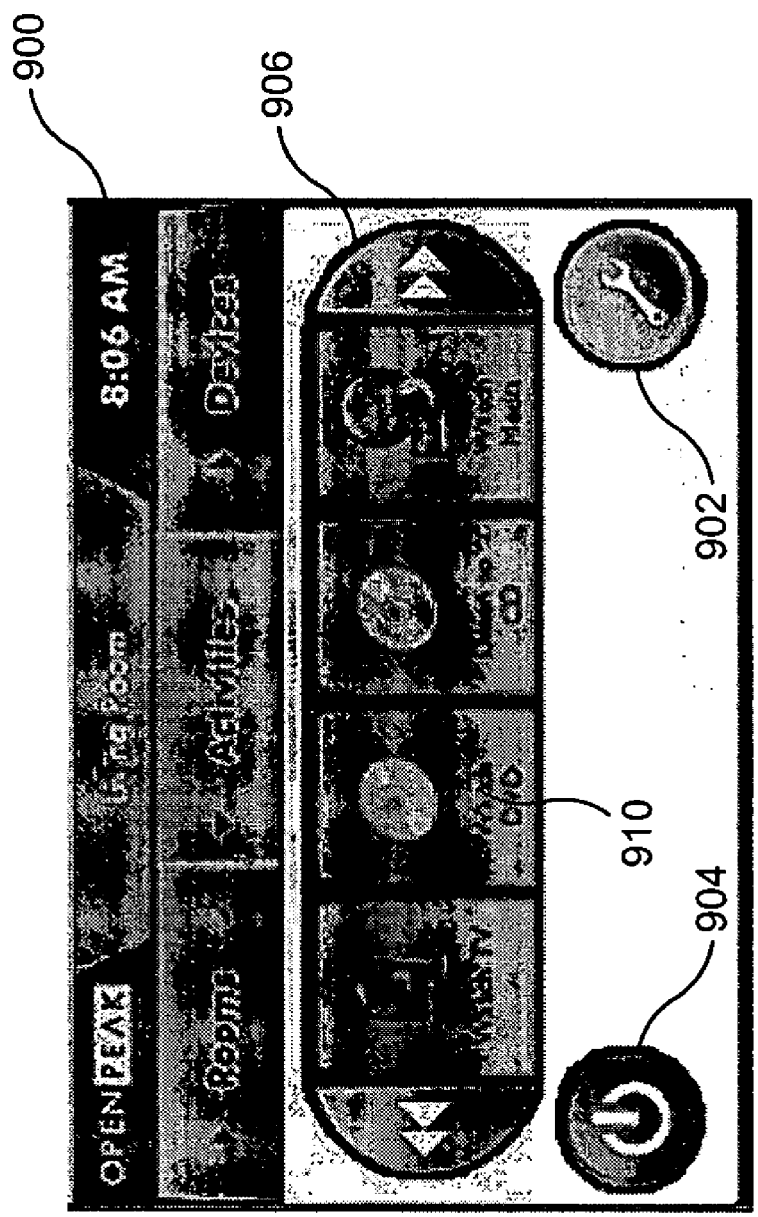
FIG. 9 is a depiction of an exemplary interface of a remote control unit in accordance with the present invention for providing automated or programmed control.

FIG. 9 is a depiction of an exemplary interface 900 of a remote control unit in accordance with the present invention for providing automated or programmed control. Interface 900 includes a configuration button 902, power button 904, and activity list 906. The configuration button 902 allows a user to configure the remote control unit for controlling a particular CE device using, for example, the interfaces 800, 820, and 840. The power button 904 allows a user to power on or off the various CE devices the remote control unit is configured to control. Activity list 906 displays a list of control items such as control item 910 that can be selected by a user to perform an automated or programmed control.

In an embodiment, selecting control item 910 causes a remote control unit in accordance with the present invention to execute a script to perform an automated or programmed control. For example, selecting a control item 910 may cause a remote control unit to execute a script to power on a TV, an amplifier, and a DVD player, set the TV's input to receive a video signal from the DVD player, set the amplifier's input to receive an audio signal from the DVD player, and command the DVD player to play the DVD that is presently loaded. The script may retrieve records related to each of the TV, amplifier, and DVD consumer electronic devices to determine the appropriate codes and the manner in which the codes should be transmitted to perform the automated or programmed control. For example, to set the TV's input to receive a video signal from the DVD player, a portion of the script may access the Metadata record, Transmission records, and Code records associated with the TV to transmit the appropriate codes to the TV to change its input.

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. An apparatus for controlling a consumer electronic device, comprising:
 a transmitter;
 a user interface;
 a storage area; and
 a control module coupled to the transmitter, the user interface, and the storage area,
 wherein the control module is configured to access a plurality of records from the storage area, based on a selection input by a user on the user interface, to transmit control signals through the transmitter to at least one consumer electronic device, wherein the control module is further configured to execute a script that supports complex commands, wherein the control module is configured to access the plurality of records as directed by the execution of the script, wherein the plurality of records includes:
 at least one metadata record,
 at least one transmission record wherein each transmission record includes: a transmission type; a model ID; a command ID; a code ID; and a multi code number, and
 at least one code record.

2. The apparatus of claim 1, wherein the control module is further configured to copy the plurality of records from an external database to the storage area.

3. The apparatus of claim 1, wherein the control module is further configured to modify the plurality of records in the storage area.

4. The apparatus of claim 1, the plurality of records further comprising:

at least one codeset record, wherein each codeset record includes:
- a codeset ID;
- a model type ID;
- a company ID; and
- a codeset name.

5. The apparatus of claim 1, the plurality of records further comprising:
at least one company record, wherein each company record includes:
- a company ID; and
- a company name.

6. The apparatus of claim 1, wherein each metadata record includes a model ID and a delay time, and wherein each code record includes a code ID and a code.

7. The apparatus of claim 6, wherein each metadata record further includes a power delay time, and
wherein the control module is configured to pause for a power delay time after transmitting a control signal to turn on the at least one consumer electronic device, wherein the power delay time is provided from a metadata record in the plurality of records.

8. An apparatus for controlling a consumer electronic device, comprising:
- a transmitter;
- a user interface;
- a storage area; and
- a control module coupled to the transmitter, the user interface, and the storage area,
wherein the control module is configured to access a plurality of records from the storage area, based on a selection input by a user on the user interface, to transmit control signals through the transmitter to at least one consumer electronic device, wherein the control module is further configured to access a database that includes:
  - at least one company record;
  - at least one model record; and
  - at least one model type record, wherein each model type record includes a model type ID and a model type name, wherein each company record includes a company name and a company ID, and wherein each model record includes a model ID and a model name, and
wherein the control module is further configured to:
  - retrieve at least one model type name from the database, display the at least one model type name;
  - receive, from a user, through the user interface a model type selection from the at least one model type name;
  - retrieve at least one company name from the database, display the at least one company name;
  - receive, from a user, through the user interface a company selection from the at least one company name;
  - retrieve at least one model name from the database, display the at least one model name;
  - receive, from a user, through the user interface a model selection from the at least one model name; and
  - populate the storage area with records containing information from the database based on the model type selection, the company selection, and the model selection.

9. The apparatus of claim 8, wherein each model record in the database further includes a model type ID and a company ID,
wherein for each retrieved model name, there exists a first model record in the database wherein a retrieved model name is the model name of the first model record,
wherein the company ID of the first model record is the company ID of a first company record, wherein the company selection is the company name of the first company record, and
wherein the model type ID of the first model record is the model type ID of a first model type record, wherein the model type selection is the model type name of the first model type record.

10. The apparatus of claim 8, wherein the control module is configured to populate the storage area with records comprising:
- at least one metadata record; and
- at least one code record.

11. The apparatus of claim 10, wherein the control module is configured to populate the storage area with records further comprising:
- at least one transmission record;
- at least one input record;
- at least one codeset record; and
- at least one command record.

12. The apparatus of claim 10, wherein the control module is configured to populate the storage area with records further comprising:
- at least one company record;
- at least one model record; and
- at least one model type record.

13. The apparatus of claim 10, wherein the metadata record comprises:
- model ID;
- delay time;
- a power delay time;
- an input type;
- a power method; and
- a power off method.

14. The apparatus of claim 13, wherein each metadata record includes a model ID and a delay time, wherein each transmission record includes a transmission type, code ID and a model ID, and wherein each code record includes a code ID and a code.

15. The apparatus of claim 14, wherein the control module is further configured to process a segment of the script, wherein the segment of the script requires a transmission of at least one code to a first consumer electronic device,
wherein the control module is configured to access a first metadata record containing a model ID that corresponds to the first consumer electronic device;
wherein the control module is configured to access a first IR code record containing a model ID that matches the model ID of the first metadata record;
wherein the control module is configured to access a first code record containing a code ID that matches the code ID of first transmission record.

16. An apparatus for controlling a consumer electronic device, comprising:
- a transmitter;
- a user interface;
- a storage area; and
- a control module coupled to the transmitter, the user interface, and the storage area,
wherein the control module is configured to access a plurality of records from the storage area, based on a selection input by a user on the user interface, to transmit control signals through the transmitter to at least one consumer electronic device, wherein the plurality of records includes:

at least one code record and
at least one metadata record, wherein each metadata record comprises:
a model ID;
a model type ID;
a company ID;
a valid mask;
an after channel delay time;
an after input delay time;
a begin channel;
a delay time;
an input pulse time;
an IR pulse time;
a power delay time;
an input type;
an one digit;
a two digit;
a three digit;
a four digit;
a power method;
a power off method;
a switch method;
an OSD use input IR as closure; and
an OSD closure two.

17. An apparatus for controlling a consumer electronic device, comprising:
a transmitter;
a user interface;
a storage area; and
a control module coupled to the transmitter, the user interface, and the storage area,
wherein the control module is configured to access a plurality of records from the storage area, based on a selection input by a user on the user interface, to transmit control signals through the transmitter to at least one consumer electronic device, wherein the plurality of records includes:
at least one metadata record and
at least one code record; and
wherein the plurality of records further comprises at least one transmission record, wherein each transmission record includes:
a transmission type;
a model ID;
a command ID;
a code ID; and
a multi code number.

18. An apparatus for controlling a consumer electronic device, comprising:
a transmitter;
a user interface;
a storage area; and
a control module coupled to the transmitter, the user interface, and the storage area,
wherein the control module is configured to access a plurality of records from the storage area, based on a selection input by a user on the user interface, to transmit control signals through the transmitter to at least one consumer electronic device, wherein the plurality of records includes:
at least one metadata record and
at least one code record; and
wherein the plurality of records further comprises at least one input record, wherein each input record includes:
an input ID;
a model type ID;
a company ID;
a model ID;
a list number;
a tunable; and
a label.

19. An apparatus for controlling a consumer electronic device, comprising:
a transmitter;
a user interface;
a storage area; and
a control module coupled to the transmitter, the user interface, and the storage area,
wherein the control module is configured to access a plurality of records from the storage area, based on a selection input by a user on the user interface, to transmit control signals through the transmitter to at least one consumer electronic device, wherein the plurality of records includes:
at least one metadata record and
at least one code record; and
wherein the plurality of records further comprises at least one model record, wherein each model record includes:
a model ID;
a model type;
a company ID;
a codeset applicable;
an ID; and
a model name.

20. A method, executing on a remote control device, of controlling a consumer electronic device, comprising:
receiving a selection from a user;
accessing a plurality of records from a storage area based on the selection, wherein the plurality of records includes at least one code record and at least one metadata record, wherein each metadata records comprises:
a model ID;
a model type ID;
a company ID;
a valid mask;
an after channel delay time;
an after input delay time;
a begin channel;
a delay time;
an input pulse time;
an IR pulse time;
a power delay time;
an input type;
an one digit;
a two digit;
a three digit;
a four digit;
a power method;
a power off method;
a switch method;
an OSD use input IR as closure; and
an OSD closure two; and
transmitting to at least one consumer electronic device a code from the plurality of records.

21. A system, comprising:
a remote control unit; and
a consumer electronic device control database;
wherein said remote control unit is adapted to receive a plurality of records from the consumer electronic device control database, and
wherein the plurality of records includes at least one code record and at least one metadata record, wherein each metadata record comprises:

a model ID;
a model type ID;
a company ID;
a valid mask;
an after channel delay time;
an after input delay time;
a begin channel;
a delay time;
an input pulse time;
an IR pulse time;
a power delay time;
an input type;
an one digit;
a two digit;
a three digit;
a four digit;
a power method;
a power off method;
a switch method;
an OSD use input IR as closure; and
an OSD closure two.

\* \* \* \* \*